United States Patent [19]

Gray et al.

[11] Patent Number: 4,680,545
[45] Date of Patent: Jul. 14, 1987

[54] METHOD FOR REDUCTION OF ACOUSTICAL NOISE GENERATED BY MAGNETIC FIELD GRADIENT PULSES

[75] Inventors: Floyd L. Gray, Hales Corners; Thomas F. Schubert, Pewaukee; Kenneth M. Bradshaw, Waukesha; Joshua O. Kolawole, Wauwatosa, all of Wis.

[73] Assignee: General Electric Company, Milwaukee, Wis.

[21] Appl. No.: 688,677

[22] Filed: Jan. 4, 1985

[51] Int. Cl.⁴ ............................................. G01R 33/20
[52] U.S. Cl. ..................................... 324/307; 324/300
[58] Field of Search ............... 324/300, 307, 309, 312, 324/314; 307/263, 268, 520, 543; 328/162, 165, 167, 185

[56] References Cited

U.S. PATENT DOCUMENTS

| | | | |
|---|---|---|---|
| 3,303,356 | 2/1967 | Bell | 307/263 |
| 4,029,972 | 6/1977 | Fox et al. | 307/263 |
| 4,339,724 | 7/1982 | Feher | 328/165 |
| 4,384,255 | 5/1983 | Young et al. | 324/309 |
| 4,438,400 | 3/1984 | Patt | 324/307 |
| 4,509,011 | 4/1985 | Sugimoto et al. | 324/309 |

FOREIGN PATENT DOCUMENTS 59-21604  5/1984  Japan .

*Primary Examiner*—Stewart J. Levy
*Assistant Examiner*—Kevin D. O'Shea
*Attorney, Agent, or Firm*—Douglas E. Stoner

[57] ABSTRACT

A method is provided for reducing acoustical noise generated when gradient coils which are part of a nuclear magnetic resonance (MR) scanner are energized by current pulses in the course of an MR study. The acoustical noise is due to vibrations of a fiber-glass coil form on which the coils are wound. The vibrations are excited by high frequency components in the squared-edged conventional current pulses. Significant noise reduction is achieved by shaping the leading and trailing current pulse edges to eliminate the objectionable high frequency components. Advantageously, the pulse edges can be shaped using sinusoidal and Bessel function waveforms. Another useful waveform for pulse shaping is a ramp function with rounded transition points.

7 Claims, 6 Drawing Figures

METHOD FOR REDUCTION OF ACOUSTICAL NOISE GENERATED BY MAGNETIC FIELD GRADIENT PULSES

BACKGROUND OF THE INVENTION

This invention relates to magnetic resonance (MR) methods. More specifically, this invention relates to method and apparatus for reduction of acoustical noise generated when gradient coils used for generating magnetic field gradients in an MR scanner are energized in the presence of a polarizing magnetic field.

The magnetic resonance phenomenon has been utilized in the past in high resolution magnetic resonance spectroscopy instruments by structural chemists to analyze the structure of chemical compositons. More recently, MR has been developed as a medical diagnostic modality having applications in imaging the anatomy, as well as in performing in vivo, non-invasive spectroscopic analysis. As is now well known, the MR resonance phenomenon can be excited within a sample object, such as a human patient, positioned in a homogeneous polarizing magnetic field, by irradiating the object with radio frequency (RF) energy at the Larmor frequency. In medical diagnostic applications, this is typically accomplished by positioning the patient to be examined in the field of an RF coil having a cylindrical geometry, and energizing the RF coil with an RF power amplifier. Upon cessation of the RF excitation, the same or different RF coil is used to detect the NMR signals emanating from the patient volume lying within the field of the RF coil. In the course of a complete MR scan, a plurality of MR signals are typically observed. The signals are used to derive MR imaging or spectroscopic information about the object studied.

In typical studies, the MR signal is usually observed in the presence of pulsed linear magnetic field gradients used to encode spatial information into the signal. Pulsed magnetic field gradients are also employed with selective RF pulses to excite nuclear spins in predetermined regions of the object undergoing examination. In the course of an MR examination, it is frequently desirable to apply pulsed magnetic field gradients in each of the x, y, and z directions of a conventional Cartesian coordinate system. It will be recognized, however, that in practice the direction in which magnetic field gradient pulses may be applied is not limited in any manner, and any direction could be selected as required.

A typical gradient coil assembly utilized in an MR scanner comprises a fiber-glass coil form on which three gradient coils, utilized for generating the $G_x$, $G_y$ and $G_z$ magnetic field gradients directed in the like-designated directions of the coordinate system, are wound. The fiber-glass coil form is selected to have a cylindrical configuration having a diameter sufficiently large to accommodate the torso of a patient in the case of a whole-body MR scanner. The complete gradient coil assembly is mounted in the bore of a magnet utilized for generating the homogeneous polarizing magnetic field. The magnet is frequently selected to be of superconductive design and is capable of generating magnetic fields in excess of 15,000 gauss. In operation, the gradient coils are energized with current pulses which may be of up to 70 amperes and having durations of approximately 3-4 milliseconds. Such current pulses create high forces in those portions of the gradient coil conductors that are perpendicular to the polarizing magnetic field. These forces create vibrations on the fiber-glass coil form that are in the audible range of approximately 63-10,000 Hz. Under such conditions, the vibrating walls of the coil form are capaable of generating high levels of acoustical noise reduction techniques, absorption, mass barriers and damping are effective, because of the noise levels involved, further reductions are desirable.

It is therefore a principal object of the invention to provide method and apparatus for achieving acoustical noise reductions beyond those achievable with conventional noise reduction techniques.

SUMMARY OF THE INVENTION

A method is provided for reducing acoustical noise generated by high frequency components of current pulses used to energize magnetic field gradient coils which form part of an MR scanner apparatus. In accordance with the method, at least one of the leading and trailing edges of at least one current pulse used to energize one gradient coil is shaped so as to substantially eliminate the high frequency components. The shaped current pulse is then applied to the gradient coil.

In the preferred embodiment, a sinusoidal waveform function is used to shape the pulse edges. Other useful waveform functions include Bessel functions and ramps with rounded transition points.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

DETAILED DESCRIPTION OF THE INVENTION

Figure 1:
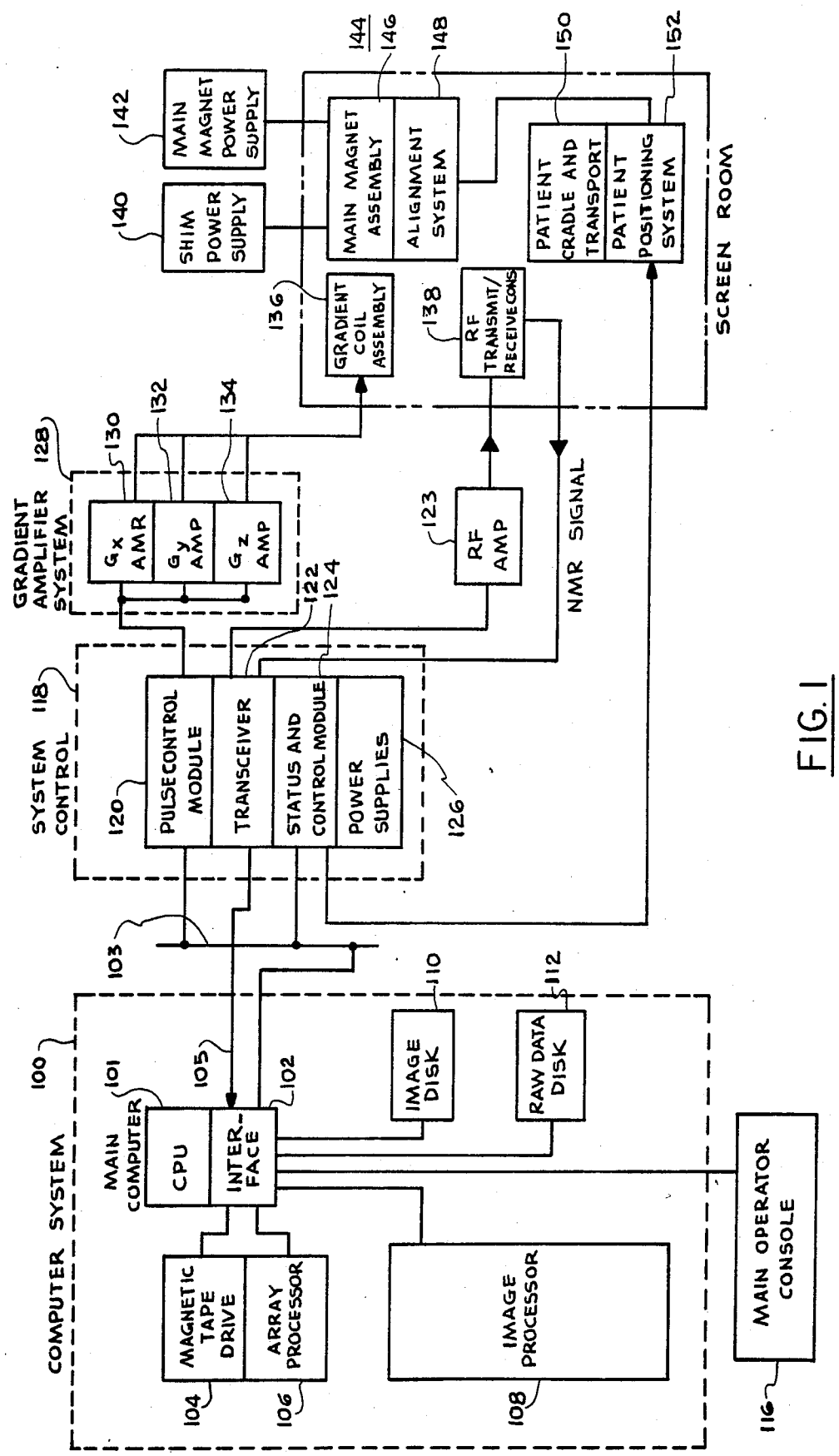
FIG. 1 is a block diagram schematic of an MR scanner system.

Referring first to FIG. 1, there is shown in block diagram form the major components of an exemplary MR system. It should be understood, however, that this is an exemplary embodiment of the apparatus and that in fact the invention is not apparatus dependent. The overall operation of the system is under the control of a host computer system generally designated 100 which includes a main computer 101 (such as a Data General MV4000). The computer has associated therewith an interface 102 through which a plurality of computer peripheral devices and other MR system components are coupled. Among the computer peripheral devices is a magnetic tape drive 104 which may be utilized under the direction of the main computer for archiving patient data and images to tape. Processed patient data may also be stored in an image disc storage device designated 110. An array processor 106 is utilized for pre-processing data and data reconstruction. The function of image processor 108 is to provide interactive image display manipulation such as magnification, image comparison, and gray scale adjustment. The computer system is provided with a means to store raw (unreconstructed) image data utilizing a disc data storage system designated 112. An operator console 116 is also coupled to the computer by means of interface 102 and provides the operator with the means to input data pertinent to a patient study as well as additional data necessary for proper MR system operation, such as initiating and terminating scans. The operator console may also be used to display images stored on discs or magnetic tape.

The computer system exercises control over the MR system by means of control and gradient amplifier systems generally designated 118 and 128, respectively. The computer communicates with system control 118 by means of a digital communication network 103 (such as the Ethernet network) in a manner well known to those skilled in the art. The system control includes several subsystems such as the pulse control module (PCM) 120, a radio frequency transceiver 122, a status and control module (SCM) 124, and the power supplies generally designated 126 necessary to energize the components. The PCM utilizes control signals provided by computer 101 to generate digital timing and control signals such as the current waveforms used for gradient coil excitation, as well as RF envelope waveforms utilized in the transceiver for modulating RF pulses. The gradient waveforms are applied to the gradient amplifier system 128 generally comprised of $G_x$, $G_y$, and $G_z$ amplifiers 130, 132, and 134, respectively, each utilized to excite a corresponding gradient coil in an assembly generally designated 136 and which is part of a magnet assembly 146. When energized, the gradient coils generate substantially linear, mutually orthogonal magnetic field gradients $G_x$, $G_y$, and $G_z$ directed in the X-, Y-, and Z-axis directions of a Cartesian coordinate system. The point of intersection defined by the planes containing each of the gradients is termed an "isocenter" and normally is situated substantially at the center of the static magnetic field volume. The reconstructed images are typically centered at the isocenter.

The gradient magnetic fields are utilized in combination with radio fequency pulses generated by transceiver 122 to encode spatial information into the MR signals emanating from the region of the patient being studied. Waveforms and control signals provided by the pulse control mode are utilized by transceiver subsystem 122 for RF carrier modulation and control of the operating mode; that is, the transmit or receive mode. In the transmit mode, the transmitter provides a radio frequency carrier waveform modulated in accordance with the control signals to an RF power amplifier 123 which then energizes RF coils 138 which are situated within main magnet assembly 146. The MR signals radiated by the excited nuclei are sensed by the same or a different RF coil than is used for transmitting. The signals are detected, filtered, and digitized in the receiver section of the transceiver. The digitized signals are transmitted to the main computer for processing by means of a dedicated, unidirectional, high-speed digital link 105 which links interface 102 and transceiver 122.

The PCM and SCM are independent subsystems both of which communicate with main computer 101, peripheral systems, such as patient positioning system 252, as well as to one another by means of link 103. The PCM and SCM are each comprised of a 16-bit microprocessor (such as an Intel 8086) for processing commands from the main computer. The SCM includes means for acquiring information regarding patient cradle (not shown) position and position of the moveable patient alignment light fan beam (not shown). This information is used by the main computer to modify image display and reconstruction parameters. The SCM also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148, a shim coil power supply 140, and a main magnet power supply 142. The shim power supply is utilized to energize shim coils associated with the main magnet and which are used to correct inhomogeneities in the polarizing magnetic field. In the case of a resistive magnet, main magnet power supply 142 is utilized to continuously energize the magnet. In the case of a superconductive magnet, the power supply is utilized to bring the magnet to the proper operating field and then is disconnected. The patient alignment system 148 operates in combination with a patient cradle and transport system 150 and patient positioning system 152. To minimize interference from external sources, the MR system components comprised of the main magnet assembly, the gradient coil assembly, and the RF transmit and receiver coils, as well as the associated power supplied and patient-handling devices, are enclosed in an RF-shielded room generally designated 144. The shielding is generally provided by a copper or aluminum screen network which encloses the entire room. The screen network serves from RF signals generated outside the room. A bidirectional attenuation of approximately 100 db. is typical in the frequency range of operation.

Figure 2:
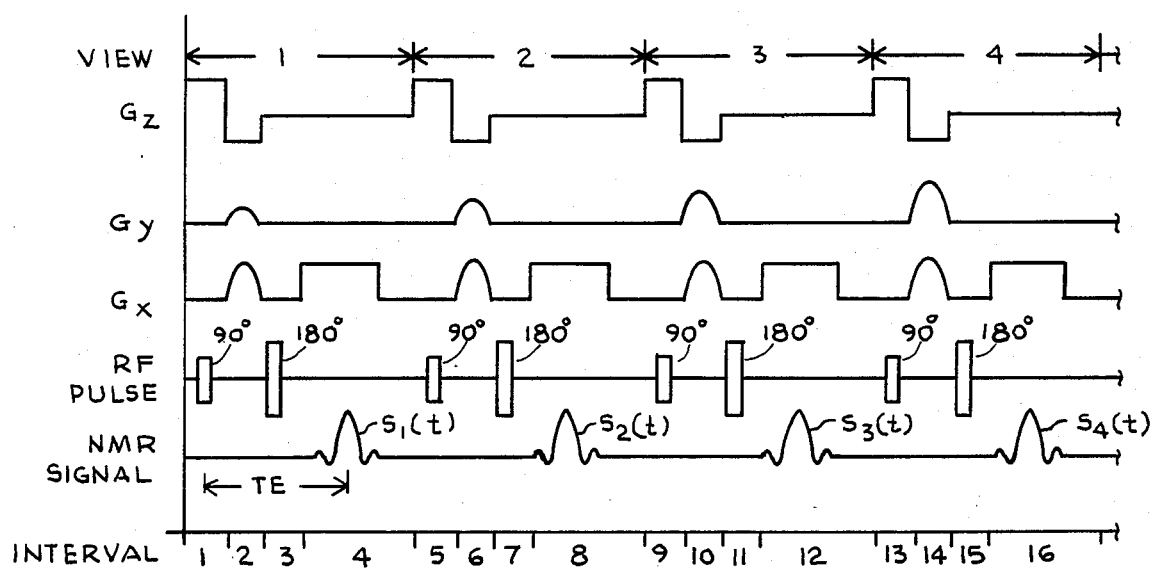
FIG. 2 depicts two views of a Fourier transform MR imaging pulse sequence of the type known as spin warp with respect to which the invention will be disclosed.

One exemplary pulse sequence useful in acquiring axial spin echo image data is shown in FIG. 2 which depicts four view of a two-dimensional Fourier transform (2DFT) MR imaging technique commonly referred to as spin warp. It will be recognized that the invention is advantageously applicable to other imaging slice orientations, such as sagittal, coronal and oblique. The views comprise intervals 1–4, 5–8, 9–12 and 13–16, as indicated along the horizontal axis. A complete pulse sequence (scan) would typically consist of a 128, 256, or 512 views which are substantially identical to one another with the exception that a different amplitude of the phase encoding magnetic field gradient pulse $G_y$, indicated along the vertical axis, is employed in each view (assuming no averaging). It will be understood that the various pulses comprising the pusle sequence are generated by the MR system described hereinabove.

One exemplary view comprising intervals 1–4 will now be described in detail with reference to the axial scan sequence of FIG. 2. In interval 1, a selective 90° RF excitaton pulse is applied in the presence of a positive $G_z$, gradient pulse so as to preferentially excite nuclear spins in a predetermined region of a sample object (not shown) having precession frequencies as predicted by the Larmor equation. A negative $g_z$, pulse is applied in interval 2 to rephase nuclear spins excited in interval 1. Typically, the $G_z$ gradient pulses are selected such that the time integral of the gradient pulse waveform over interval 2 is equal to a negative one half of the time integral of the gradient pulse waveform over interval 1. $G_x$ and $G_y$ magnetic field gradient pulses are applied simultaneously with the $G_z$ gradient pulse in interval 2. The function of the $G_y$ gradient is as alluded to hereinabove, to encode phase information into the excited nuclear spins. The purpose of the $G_x$ gradient pulse is to dephase the excited nuclear spins by a predetermined amount to delay the occurrence of the MR spin echo signal in interval 4 to a time TE after the mean application of the excitation pulse in interval 1. The spin echo signal is produced by the application of a 180° inverting pulse in interval 3. The spin echo signal is sampled in interval 4 in the presence of a linear $G_x$ readout gradient. The MR information encoded in the MR signal by the phase encoding and the readout gradients is recovered in a well-known manner using two-dimensional Fourier transform techniques.

The excitation/sampling process, as described hereinabove, is repeated in each view of the pulse sequence until the $G_y$ gradient is sequenced through its range of amplitudes (128, 256, etc.). In this manner, in the course of a complete scan spin echo signals are observed in each view thereby providing sufficient data to reconstruct an image of the region examined. The repetition time TR is the period of time between the beginning of a pulse sequence of one view and the beginning of a succeeding (essentially identical, except for the amplitude of the $G_y$ phase encoding gradient) pulse sequence of the next view. As depicted in FIG. 2, TR is measured between the mean application of 90° RF pulses in succeeding views. Typically, TR is not varied in the course of a single scan, but can be varied from one scan to the next. In a pulse sequence utilizing a single spin echo signal such as that occurring in interval 4, TR is selected to be sufficiently long to allow magnetization to return to equilibrium prior to the next excitation RF pulse.

Conventional, unshaped magnetic field gradient pulses having square edges, such as the $G_x$ and $G_z$ pulses described with reference to FIG. 2, contain a full spectrum of audio frequencies from a few $h_z$ to above 20,000 $H_z$. When the gradient coils are energized to generate gradient pulses, the higher frequency components cause the gradient coil waveform to vibrate and thereby generate acoustical noise, including frequencies of between approximately 2,000 to 10,000 Hz, which are most objectionable to the ear. The acoustical noise is generated by both the leading and trailing edges of the square gradient pulses. Conventional gradient pulses are square-edged because it is desirable to minimize gradient pulse rise times to shorten the time needed for the gradient to reach the desired constant value. The invention provides a technique to reduce gradient coil noise while maintaining gradient pulse rise time within acceptable limits.

It has been found that substantial reduction in acoustical noise can be achieved by removal of the high frequency components in the gradient pulses. This can be achieved by any suitabe method that reduces the slope of the leading and trailing edges of the square-edged magnetic field gradient pulses. For example, when a low-pass Bessel filter having a 48 dB/octave roll off was used to filter a square wave input signal to 1,000 Hz or less, the acoustical noise frequency was also limited to 1,000 Hz or less. A reduction in the acoustical noise of approximately 5–15 dB (depending on frequency) was achieved.

Figure 3:
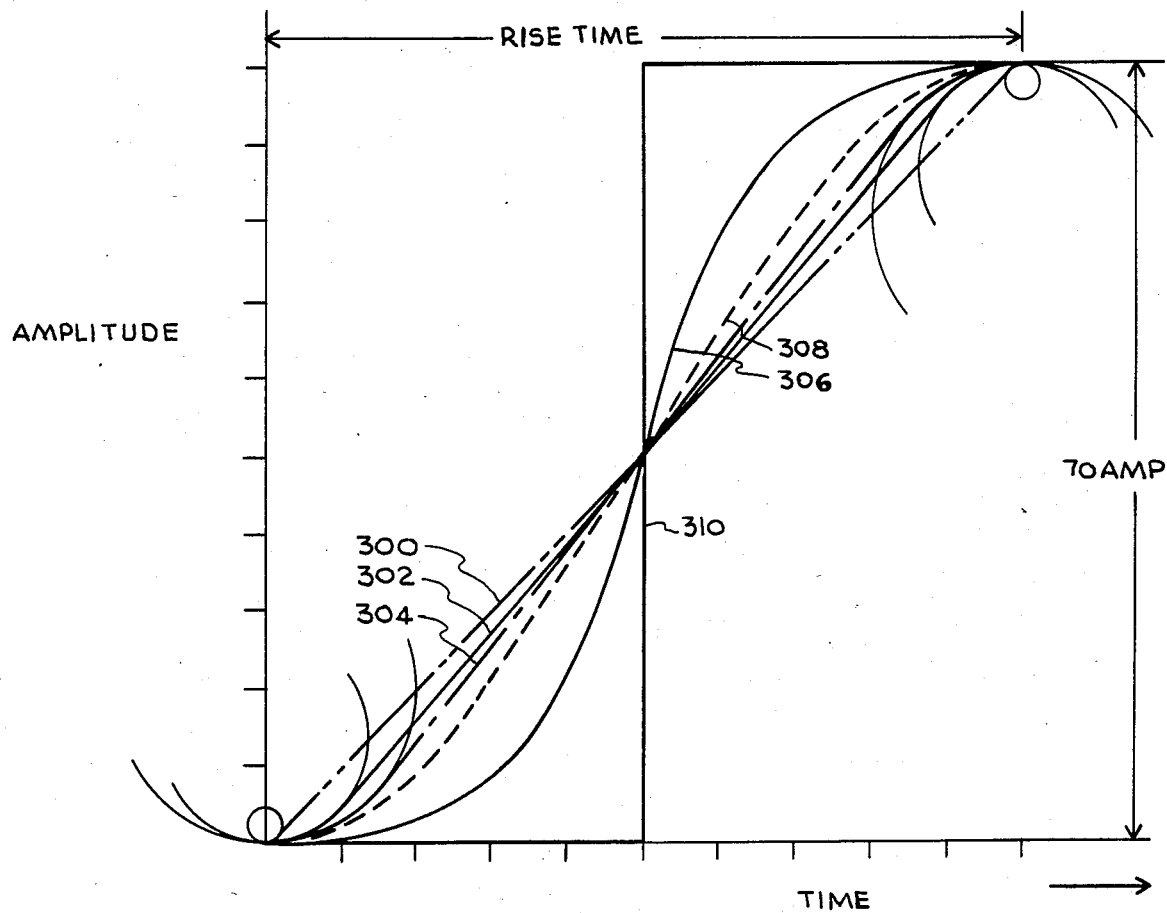
FIG. 3 depicts several exemplary wave shapes utilized in shaping the gradient pulses for the purpose of achieving acoustical noise reduction.

FIG. 3 depicts five exemplary waveforms 300, 302, 304, 306, and 308 superimposed on the leading edge of a conventional square-edged magnetic field gradient pulse 310 for the purpose of removing high frequency components. It will be, of course, recognized that similar waveforms can be employed to shape the trailing edge of a gradient pulse. Waveforms 300, 302, and 304 are similar in that all utilize a circle and tangent line (ramp with rounded transition points) to reduce the slope of the conventional gradient pulse. While the circle and tangent are moderately effective, additional improvement in noise reduction can be achieved using either a Bessel function waveform 306 or a sine waveform 308. A Bessel function waveform has the fastest rise time, with the lowest frequency content. Due to its faster rise time, it is more demading of gradient amplifier performance. In the preferred embodiment, a sine waveform is utilized to shape the leading edges of the gradient pulses. Sine waveforms are easy to generate and are more easily handled by gradient amplifiers.

Figure 4B:
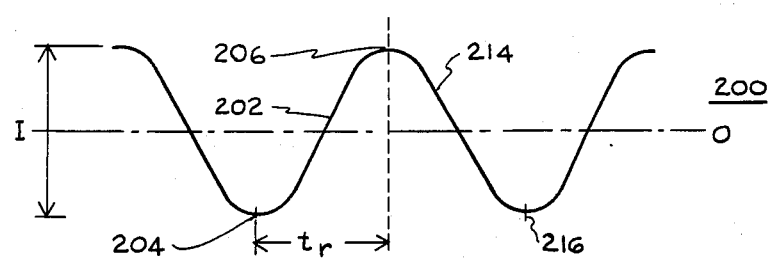
FIGS. 4A and 4B depict gradient pulses shaped in accordance with the invention using a sine function.
Figure 4A:
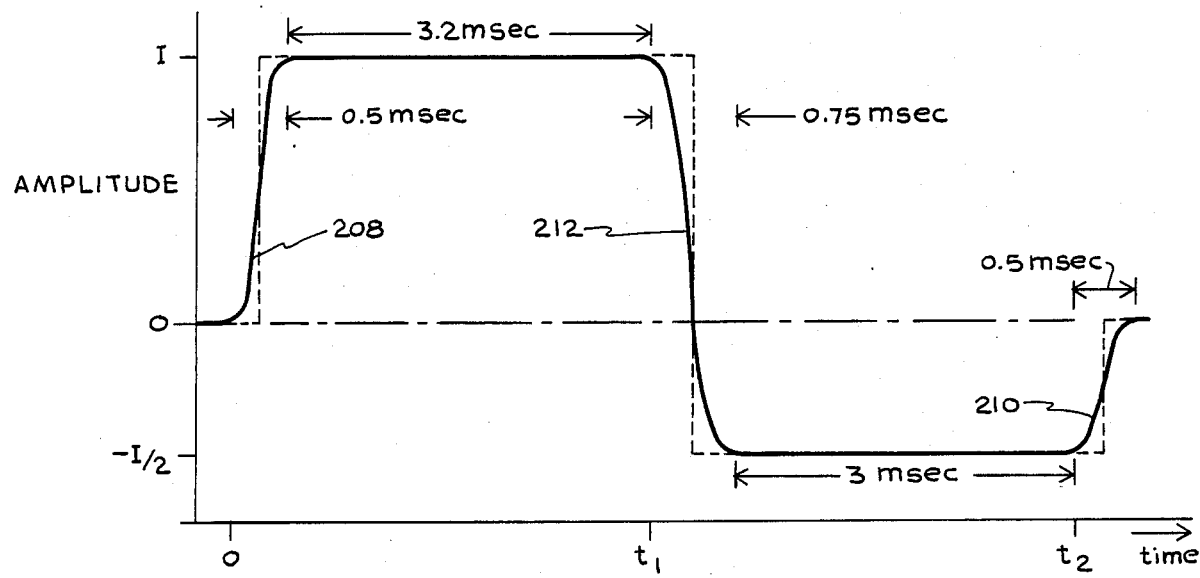

The manner in which the leading and trailing edges of a gradient pulse are shpaed in the preferred embodiment, using a sine function, will now be described by way of example with reference to FIGS. 4A and 4B. FIG. 4A depicts the positive and negative portions of a $G_z$ gradient pulse, such as those occurring in intervals 1 and 2, respectively, of a pulse sequence, such as that depicted in FIG. 2. The pulse, wave shaped in accordance with the invention, is shown by solid lines, while the conventional square-edge pulse (for comparison) is depicted by dashed lines. FIG. 4B illustrates a sinusoidal waveform, generally designated 200, having a peak amplitude I and a peak-to-peak rise time $t_r$. A portion 202 between points 204 and 206 of waveform 200, comprising the leading one-half cycle of the sinusoidal waveform, is used, after appropriate scaling, to modify leading edge 208 of the $G_z$ gradient pulse in intervals 1 and trailing edge 210 of the pulse in interval 2. Gradient pulse transition 212 (FIG. 4A) of the $G_z$ gradient pulse between intervals 1 and 2 is shaped using the trailing one-half cycle portion 214, between points 206 and 216, of the sinusoid shown in FIG. 4B. By way of example, a typical amplitude of the $G_z$ gradient pulse in interval 1 is approximately 70 amperes, and approximately 35 amperes in interval 2. A typical rise time for the shaped edges of the $G_z$ gradient pulse is approximately 0.5 msec.

Sinusoidal waveforms, 208, 210, and 212 are described, respectively, by Equations (1), (2) and (3).

$$i(t) = \frac{I}{2}\left(1 - \cos\left[\frac{\pi t}{t_r}\right]\right), \tag{1}$$

$$i(t) = -\frac{I}{4}\left(1 + \cos\left[\frac{\pi(t - t_2)}{t_r}\right]\right), \tag{2}$$

$$i(t) = \frac{3I}{4}\cos\left[\frac{\pi(t - t_1)}{t_r}\right] + \frac{I}{4}, \tag{3}$$

wherein i(t) is the desired current pulse waveform used to energize the gradient coils, I is the peak pulse amplitude (FIG. 4A), and $t_r$ is the rise time.

It will be recognized that the foregoing description is exemplary. Other gradient pulses may be shaped in a similar manner using an appropriate waveform to eliminate objectionable high frequency components.

Figure 5:
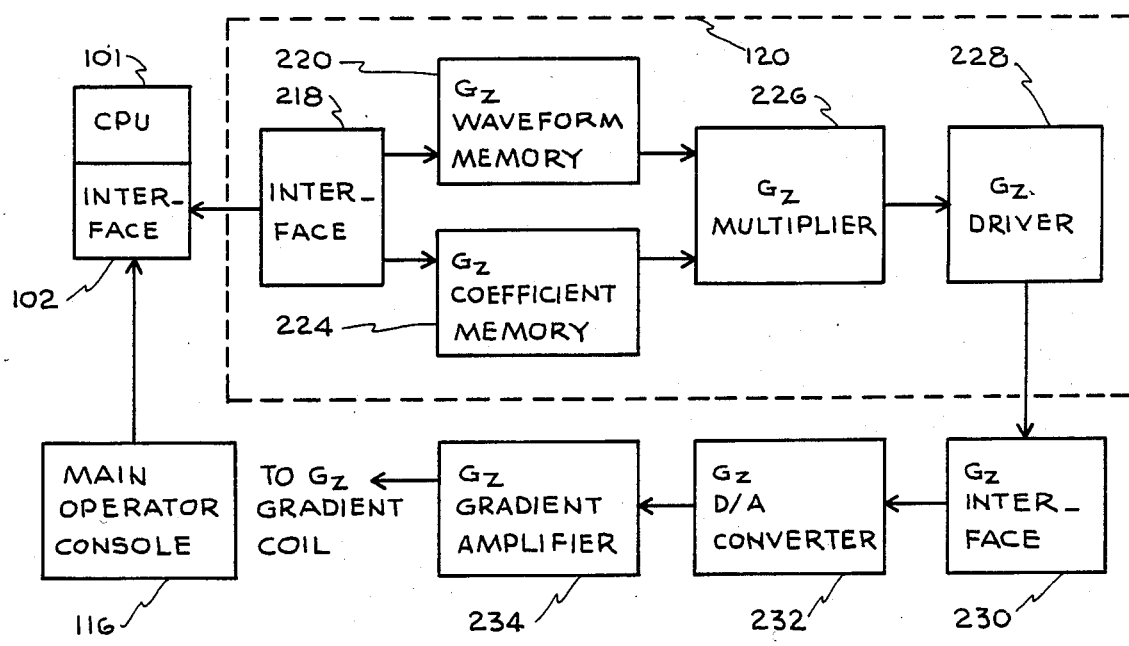
FIG. 5 illustrates in greater detail the apparatus utilized in generating the wave shapes utilized for reduction of acoustical noise in accordance with the invention.

The manner in which the $G_z$ gradient waveform is shaped using sinusoidal edges, as discussed with reference to FIGS. 4A and 4B, will now be described with reference to FIG. 5. FIG. 5 depicts a portion of pulse control module (PCM) 120 relating to the generation of the $G_z$ gradient pulse. It will be recognized that a separate waveform memory 220, coefficient memory 224, multiplier 226, driver 228, output interface 230 and D/A converter 232 are provided for generating $G_x$ and $G_y$ gradient waveforms.

Referring now to FIG. 5, PCM 120 communicates with CPU 101 through computer interface 102 and an interface 218 which is part of the PCM. Interface 102 and 218 comprise an Ethernet communication link. The function of interface 218 is to receive information from the CPU and to transfer this information to a waveform memory 220 and coefficient memory 224. Interface 218 operates in a similar manner to transfer information to waveform and coefficient memories (not shown) associated with $G_x$ and $G_y$ gradients. Output signals of waveform memory 220 and coefficient memory are applied to a multiplier unit 226, the output of which is applied through a driver unit 228 to an output interface 230. The function of interface 230 is to apply the digitized waveform signal to a digital-to-analog (D/A) converter 232 which energizes $G_z$ gradient amplifier 234 forming part of gradient amplifier system 128 (FIG. 1). The output of the gradient amplifier is used to energize the $G_z$ gradient coil in gradient coil assembly 136 (FIG. 1).

In operation, main operator console 116 (FIG. 5), coupled to CPU 101 through interface 102, is used to select particular pulse sequence scan parameters which will be used to examine the patient. To this end, CPU 101 generates, based on the scan parameter, appropriate RF and gradient pulses and sequence timing comprising one view of a pulse sequence such as that described with reference to FIG. 2. The generated waveforms are stored in normalized form in waveform memories, such as waveform memory 220, while coefficient information is stored in coefficient memories, such as coefficient memory 224, in the pulse control module for use during an examination. The points needed to wave shape the rising and trailing edges of the square-edged gradient pulses are calculated in CPU 101 using Equations (1)–(3) in the case of the $G_z$ gradient pulse in intervals 1 and 2 described hereinabove.

In the course of an examination, waveform points are sequentially retrieved from the waveform memory and simultaneously a corresponding coefficient is retrieved from coefficient memory. The waveform information along with the coefficient information are applied to multiplier 218 where the point is multiplied by the coefficient thereby scaling it to the desired amplitude. The retrieval and multiplication process is repeated for each point of the waveforms to generate one view of a pulse sequence. In subsequent views, the process of retrieving information from waveform and coefficient memories is repeated without change. An exception is that new coefficients are used to generate a different amplitude of the $G_y$ gradient pulse.

The preferred embodiment has been described hereinabove with reference to a sinusoidal shaping of the gradient pulse leading and trailing edges. It will be recognized that wave shaping using the waveforms depicted in FIG. 3, or other waveforms, can be accomplished in a similar manner.

It will be noted that a conventional Bessel filter can be used to eliminate the objectionable high frequency components. The manner in which this could be accomplished is to apply a conventional square-edged pulse to a filter having a Bessel function transfer charaacteristic. The output of the filter is applied to a gradient amplifier prior to energizing the corresponding gradient coil.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

The invention claimed is:

1. A method of reducing acoustical noise generated by high frequency components of current pulses used to energize magnetic field gradient coils which form part of an MR scanner apparatus, said method comprising the steps of:

shaping at least one of the leading and trailing edges of at least one of said current pulses used to energize at least one of said magnetic field gradient coils so as to substantially eliminate said high frequency components; and applying said shaped current pulse to said one of said gradient coils.

2. The method of claim 1 wherein said step of shaping comprises imparting a sinusoidal waveform to at least one of said leading and trailing edges.

3. The method of claim 2 wherein said sinusoidal waveform used for shaping said leading edge is described by $$i(t) = \frac{I}{2}\left(1 - \cos\left[\frac{\pi t}{t_r}\right]\right), \qquad (1)$$

wherein

I is the peak amplitude of the sinusoid $t_r$ is the rise time.

4. The method of claim 2 wherein said sinusoidal waveform used for shaping said trailing edge is described by $$i(t) = -\frac{I}{4}(1 + \cos\left[\frac{\pi(t - t_2)}{t_r}\right]), \qquad (2)$$

wherein

I is the peak amplitude of the sinusoid $t_r$ is the rise time.

5. The method of claim 2 wherein said sinusoidal waveform is described by $$i(t) = \frac{3I}{4}\cos\left[\frac{\pi(t - t_1)}{t_r}\right] + \frac{I}{4}, \qquad (3)$$

wherein

I is the peak amplitude of the sinusoid $t_r$ is the rise time.

6. The method of claim 1 wherein said step of shaping comprises imparting a waveform described by a Bessel function to at least one of said leading and trailing edges.

7. The method of claim 1 wherein said step of shaping comprises imparting a waveform to one of said leading and trailing edges described by a ramp function having rounded transistion points.

* * * * *